(12) United States Patent
Choi et al.

(10) Patent No.: US 8,030,833 B2
(45) Date of Patent: Oct. 4, 2011

(54) ELECTRON EMISSION DEVICE INCORPORATING FREE STANDING MONOCRYSTALLINE NANOWIRES

(75) Inventors: Hyungsoo Choi, Champaign, IL (US); Kyekyoon Kim, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 757 days.

(21) Appl. No.: 12/069,910

(22) Filed: Feb. 13, 2008

(65) Prior Publication Data

US 2008/0206555 A1 Aug. 28, 2008

Related U.S. Application Data

(63) Continuation-in-part of application No. 10/664,431, filed on Sep. 19, 2003, now Pat. No. 7,344,753.

(51) Int. Cl.
*H01J 1/30* (2006.01)
*H01J 1/304* (2006.01)

(52) U.S. Cl. ........ 313/311; 313/309; 313/495; 977/762; 977/932; 977/939; 977/952

(58) Field of Classification Search .......... 313/495–497, 313/309–311; 977/762, 932, 939, 952
See application file for complete search history.

(56) References Cited

U.S. PATENT DOCUMENTS

| | | | |
|---|---|---|---|
| 4,554,322 A | 11/1985 | Kwiecinski | |
| 5,980,983 A | 11/1999 | Gordon | |
| 6,037,001 A | 3/2000 | Kaloyeros et al. | |
| 6,060,121 A | 5/2000 | Hidber et al. | |
| 6,066,196 A | 5/2000 | Kaloyeros et al. | |
| 6,102,993 A | 8/2000 | Bhandari et al. | |
| 6,187,165 B1 | 2/2001 | Chien et al. | |
| 6,231,744 B1 | 5/2001 | Ying et al. | |
| 6,248,674 B1 | 6/2001 | Kamins et al. | |
| 6,286,226 B1 | 9/2001 | Jin | |
| 6,297,063 B1 | 10/2001 | Brown et al. | |
| 6,313,015 B1 | 11/2001 | Lee et al. | |
| 6,325,904 B1 | 12/2001 | Peeters | |
| 6,340,768 B1 | 1/2002 | Welch et al. | |

(Continued)

FOREIGN PATENT DOCUMENTS

EP 1100106 A2 5/2001

(Continued)

OTHER PUBLICATIONS

Barbic etal. "Single crystal silver nanowires prepared by the metal amplification method" Journal of Applied Physics, vol. 91 No. 11, Jun. 2002, pp. 9341-9345.*

(Continued)

*Primary Examiner* — Mariceli Santiago
(74) *Attorney, Agent, or Firm* — Krieg DeVault LLP; L. Scott Paynter

(57) ABSTRACT

One embodiment includes forming a nanowire on a substrate from an organometallic vapor. The nanowire is grown during this formation in a direction away from the substrate and is freestanding during growth. The nanowire has a first dimension of 500 nanometers or less and a second dimension extending from the substrate to a free end of the nanowire at least 10 times greater than the first dimension. In one form, the organometallic vapor includes copper, silver, or gold. Alternatively or additionally, the nanowire is of a monocrystalline structure.

11 Claims, 12 Drawing Sheets

U.S. PATENT DOCUMENTS

| | | |
|---|---|---|
| 6,340,822 B1 | 1/2002 | Brown et al. |
| 6,359,288 B1 | 3/2002 | Ying et al. |
| 6,368,406 B1 | 4/2002 | Deevi et al. |
| 6,383,923 B1 | 5/2002 | Brown et al. |
| 6,388,185 B1 | 5/2002 | Fleurial et al. |
| 6,407,443 B2 | 6/2002 | Chen et al. |
| 6,440,763 B1 | 8/2002 | Hsu |
| 6,444,256 B1 | 9/2002 | Musket et al. |
| 6,448,701 B1 | 9/2002 | Hsu |
| 6,450,189 B1 | 9/2002 | Ganan-Calvo |
| 6,465,132 B1 | 10/2002 | Jin |
| 6,504,292 B1 | 1/2003 | Choi et al. |
| 6,509,619 B1 | 1/2003 | Kendall et al. |
| 6,518,156 B1 | 2/2003 | Chen et al. |
| 6,525,461 B1 | 2/2003 | Iwasaki et al. |
| 6,538,147 B1 | 3/2003 | Choi |
| 2002/0055239 A1 | 5/2002 | Tuominen et al. |
| 2002/0158342 A1 | 10/2002 | Tuominen et al. |
| 2002/0172820 A1 | 11/2002 | Majumdar et al. |
| 2002/0187504 A1 | 12/2002 | Reich et al. |
| 2004/0106203 A1* | 6/2004 | Stasiak et al. .................. 422/58 |
| 2005/0199886 A1 | 9/2005 | Yi et al. |

FOREIGN PATENT DOCUMENTS

| | | |
|---|---|---|
| WO | WO 00/08225 A | 2/2000 |
| WO | WO 02/080280 A1 | 10/2002 |

OTHER PUBLICATIONS

Sauer et al. "Highly ordered monocrystalline silver nanowire arrays" Journal of Applied Physics, vol. 91 No. 5, Mar. 2002, pp. 3243-3247.*

Zhang et al. "Field emission from an array of free-standing metallic nanowires" Chin. Phys. Lett., vol. 19, No. 7 (2002), pp. 1016-1018.*

Gao et al. "Template synthesis of single-crystal Cu nanowire arrays by electrodeposition" Appl. Phys. A 73, 251-254 (2001).*

Davydov et al. "Field emitters based on porous aluminum oxide templates" Journal of Applied Physics vol. 86 No. 7, Oct. 1999, pp. 3983-3987.*

Rao et al. "Nanotubes and nanowires" Proc. Indian. Acad. Sci. (Chem. Sci.), vol. 113, Nos. 5 & 6, Oct.-Dec. 2001, pp. 375-392.*

Toimil Morales et al. "Etched heavy ion tracks in polycarbonate as template for copper nanowires" Nuclear Instruments and Methods in Physics Research B 185 (2001), pp. 192-197.*

Ross, F., et al., "Ion-induced chemical vapor deposition of copper films with nanocellular microstructures," Aug. 11, 2003, App. Phys. Lett. 83(6) 1225-1227.

Liu, et al., "A Novel Method for Preparing Copper Nanorods and Nanowires" Adv. Mater Feb. 2003, 15(3), pp. 303-305.

Gao, et al., "Electrochemical synthesis of copper nanowires" J. Phys. Condns. Matter 14 (Jan. 2000) pp. 355-363.

* cited by examiner

ELECTRON EMISSION DEVICE INCORPORATING FREE STANDING MONOCRYSTALLINE NANOWIRES

CROSS-REFERENCE TO RELATED APPLICATIONS

The present application is a continuation-in-part of U.S. patent application Ser. No. 10/664,431 filed Sep. 19, 2003 now U.S. Pat. No. 7,344,753, which is hereby incorporated by reference.

BACKGROUND OF THE INVENTION

The present invention relates to nanostructures and nanostructure formation techniques, and more particularly, but not exclusively, relates to metallic nanowires.

With the constantly decreasing feature sizes of integrated circuits and other microscale devices, the need for increasingly fine patterning of such features present several challenges. Among these challenges is the need to provide various nanostructures, including electrically conductive nanowires. One of the schemes to fabricate nanowires utilizes a lithographic pattern to define an array of closely spaced nanowires that are deposited by chemical vapor deposition or another technique. One drawback of this approach is that lithographic patterning is limited in terms of size and tolerance in the nanometer range.

A related scheme involves filling arrays of channels or pores in a substrate with a material of interest by chemical or electrochemical processes. With this method, it is difficult to continuously fill pores having a relatively long length and small diameter with a desired material having high density. In some instances, to adequately fill the pores, high pressure and high temperature injection of molten metals has been used; however, the fabrication of nanowires from small pores with long length frequently becomes undesirable because of the extreme pressure/temperature involved. Attempts to lower the processing pressure by modifying the composition or surface property of the substrate pores have the further limitation of being applicable with only low melting point metals.

Another scheme bombards a material with ions to form tracks into which the nanowire material is deposited. The track-bearing material is then at least partially removed, leaving the exposed nanowires. U.S. Pat. No. 6,444,256 B1 to Musket et al. provides further background information regarding this approach. Such schemes are complicated by the need to remove the material that defined the tracks. A similar drawback arises for other approaches that utilize a template to define channels or pores for forming nanostructures.

An article by Ross et al. describes the growth of copper columns by ion-induced chemical vapor deposition (IT-CVD) in which a carbonaceous material is positioned between the copper columns. This material extends from the boundary of one column to the next, and separates the columns to provide a solid structure about them. Ross et al., *Ion-Induced Chemical Vapor Deposition of Copper Films with Nanocellular Microstructures*, APPLIED PHYSIC LETTERS, vol. 83, No. 6 (11 Aug. 2003).

A step-edge decoration method has been reported to grow freestanding nanowires, where Mo oxide wires were electrodeposited at step edges on a graphite surface and reduced in $H_2$ to produce metal. This method is not applicable to produce noble metals, including gold (Au), silver (Ag), platinum (Pt), and copper (Cu), which typically do not nucleate along step edges on graphite to form nanowires. Another method reported is to synthesize Au, Ag and Pt nanowires using reducing and sacrificing templates. Neither step-edge decoration nor sacrificing template methods are capable of producing vertically aligned freestanding metal nanowires. Still other schemes involve a catalyst to provide for the freestanding deposition of carbon nanotubes to which a metallic coating may then be applied. U.S. Pat. No. 6,340,822 B1 to Brown et al. provides further background regarding this approach. These schemes all fail to provide for the growth of freestanding nanowires comprised of metals without complicated post-growth processing. Thus, there is a demand for further contributions in this area of technology.

SUMMARY

As used herein "freestanding" refers to the capability of vertically extending from a base or substrate without support from a template or patterning device. As used herein, "monocrystalline" refers to a solid material having more than 90% by weight organized in a single crystal structure that may include low angle twisting.

One embodiment of the present invention includes a unique technique of providing nanostructures. Other embodiments include unique methods, systems, devices, and apparatus involving nanostructures.

A further embodiment includes depositing a number of nanostructures on a substrate from an organometallic vapor. The nanostructures are composed of material including a metal, at least some of which is deposited from the vapor. In one form, the nanostructures define nanowires that are freestanding during deposition. Additionally or alternatively, the nanostructures are each monocrystalline.

Still a further embodiment of the present invention includes forming a number of nanostructures on a substrate with an organometallic vapor including copper. The nanostructures are freestanding during formation. For one form, the nanostructures each have a first dimension of 500 nanometers or less and a second dimension extending from the substrate to a respective free end of each of the nanostructures which is at least 10 times greater than the first dimension.

Yet another embodiment of the present invention includes growing a number of monocrystalline nanowires on a substrate from an organometallic vapor including copper and providing the nanowires with a first dimension of 500 nanometers of less after growth.

Another embodiment of the present invention includes a substrate and a plurality of freestanding nanostructures attached to the substrate that are each monocrystalline and comprised of copper. In one form, the nanostructures each extend from a dielectric surface of the substrate. In other forms, the nanostructures extend from a metallic or semiconductor surface of the substrate. Alternatively or additionally, the nanostructures are in the form of nanowires that each includes a respective free end and have a first dimension of 500 nanometers or less and a second dimension extending from the substrate to the respective free end that is at least 10 times greater than the first dimension.

One object of the present invention is to provide a unique technique for providing nanostructures.

Another object of the present invention includes a unique method, system, device, or apparatus involving a nanostructure.

Further objects, forms, embodiments, benefits, advantages, features, and aspects of the present invention shall become apparent from the description and drawings contained herein.

DETAILED DESCRIPTION

Figure 1:
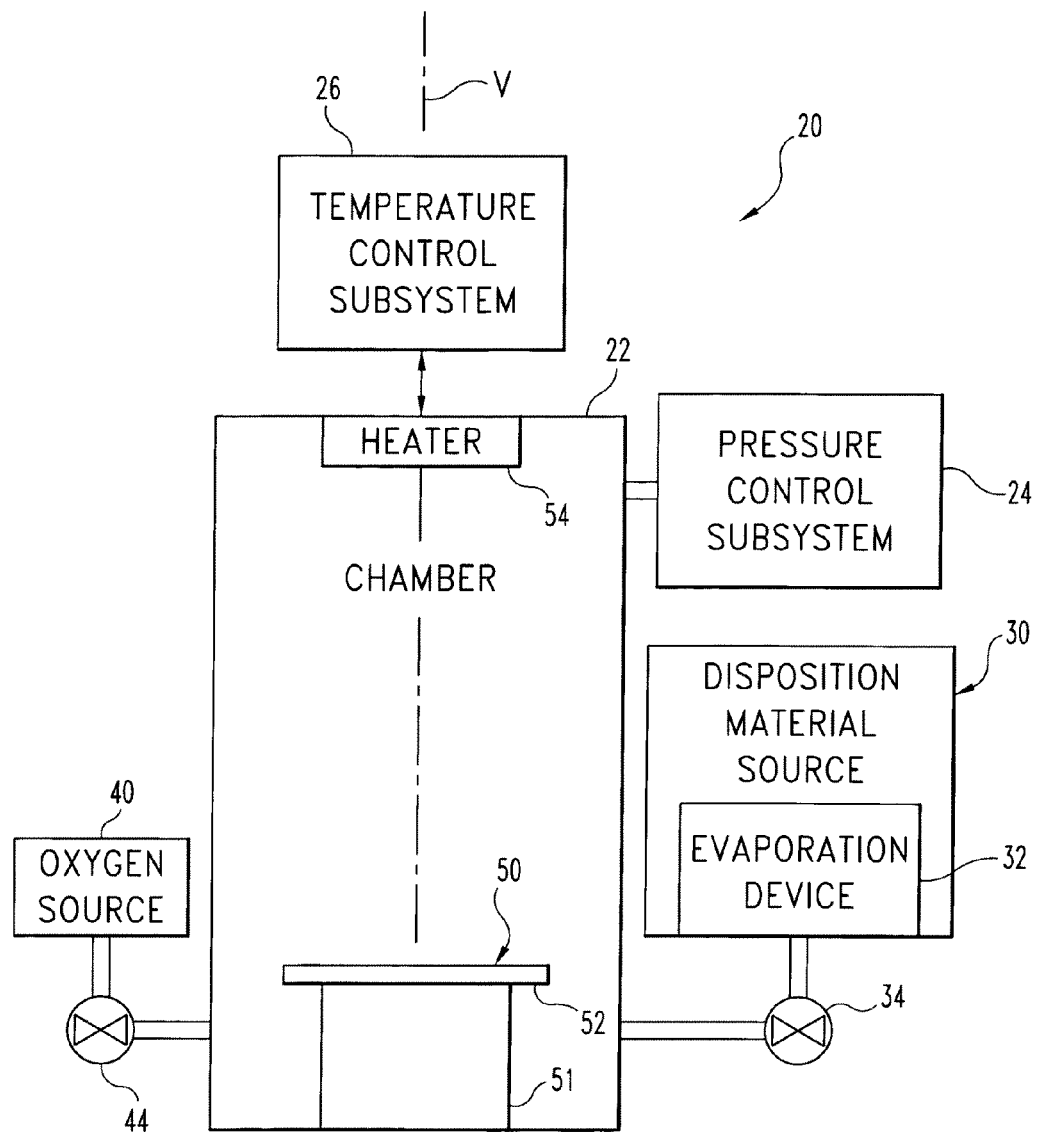
FIG. 1 is a diagrammatic view of a nanostructure formation system.

For the purposes of promoting an understanding of the principles of the invention, reference will now be made to the embodiments illustrated in the drawings and specific language will be used to describe the same. It will, nevertheless, be understood that no limitation of the scope of the invention is thereby intended. Any alterations and further modifications in the described embodiments and any further applications of the principles of the invention as described herein are contemplated as would normally occur to one skilled in the art to which the invention relates.

One embodiment of the present invention is a technique to provide metal-containing nanostructures. In one example, a freestanding nanostructure is grown on a substrate by Chemical Vapor Deposition (CVD) using an organometallic substance without a catalyst or reducing agent. The nanostructure is composed of an elemental metal, an alloy of two or more different types of metal, and/or includes one or more types of metal in combination with intermetallics and/or nonmetals, such as oxygen. The substrate can be comprised of a metallic material, intermetallic material, semiconductor, dielectric material, a combination of these, and/or a different material as would occur to those skilled in the art. In a further embodiment, freestanding nanowires are formed on a substrate through a deposition process with the substrate temperature being 400° C. or less. This deposition process can include forming the nanowires with an organometallic substance including copper.

Other examples and embodiments of the present invention are described in connection with nanostructure formation system 20 depicted in FIG. 1. System 20 includes processing chamber 22 coupled to pressure control subsystem 24 and temperature control subsystem 26. Pressure control subsystem 24 regulates gas pressure in chamber 22. Temperature control subsystem 26 includes heating device 54 within chamber 22 to regulate temperature of a work piece and/or other chamber contents. Chamber 22, subsystem 24, and subsystem 26 are arranged in a standard manner to facilitate Chemical Vapor Deposition (CVD), and/or plasma-assisted CVD procedures. System 20 also includes deposition material source 30 and oxygen source 40. Deposition material source 30 includes evaporation device 32 to generate a deposition vapor. Source 30 is coupled to chamber 22 by valve 34 that is adjustable in a standard manner to selectively provide vapor from source 30 to chamber 22. Oxygen source 40 is coupled to chamber 22 by valve 44. Valve 44 is adjustable to selectively provide oxygen ($O_2$) to chamber 22. In other embodiments, source 40/valve 44 may be used for the selective introduction of one or more other types of gaseous materials as an addition or alternative to oxygen. Also, other gaseous materials such as a carrier gas, like Argon (Ar), or other processing materials can be provided in system 20 (not shown). For example, system 20 can include a plasma generation/source, a Physical Vapor Deposition (PVD) subsystem, an ion implantation arrangement, and/or different processing equipment as would occur to those skilled in the art.

Figure 2:
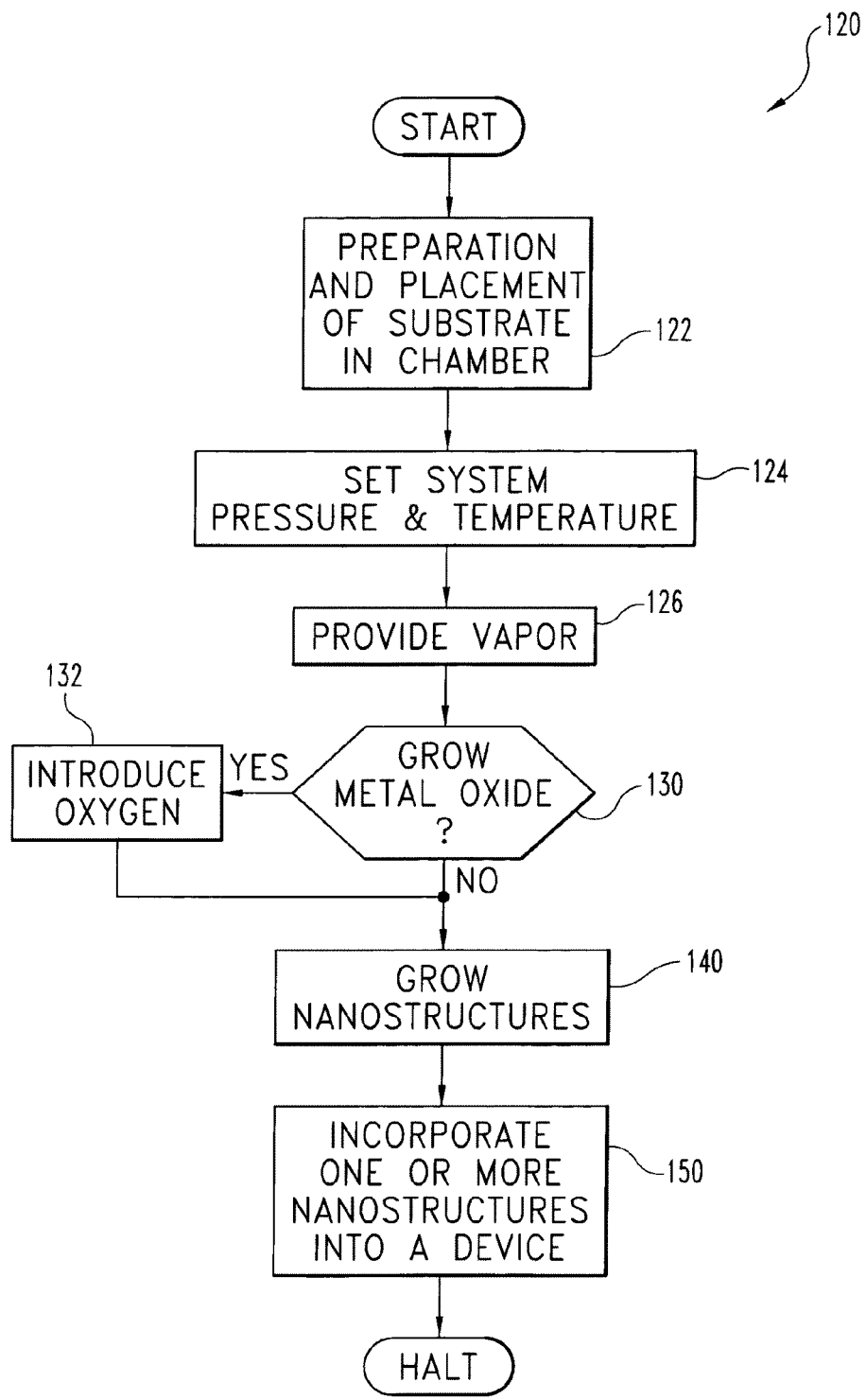
FIG. 2 is a flow chart of a process that can be performed with the system of FIG. 1.
Figure 3:
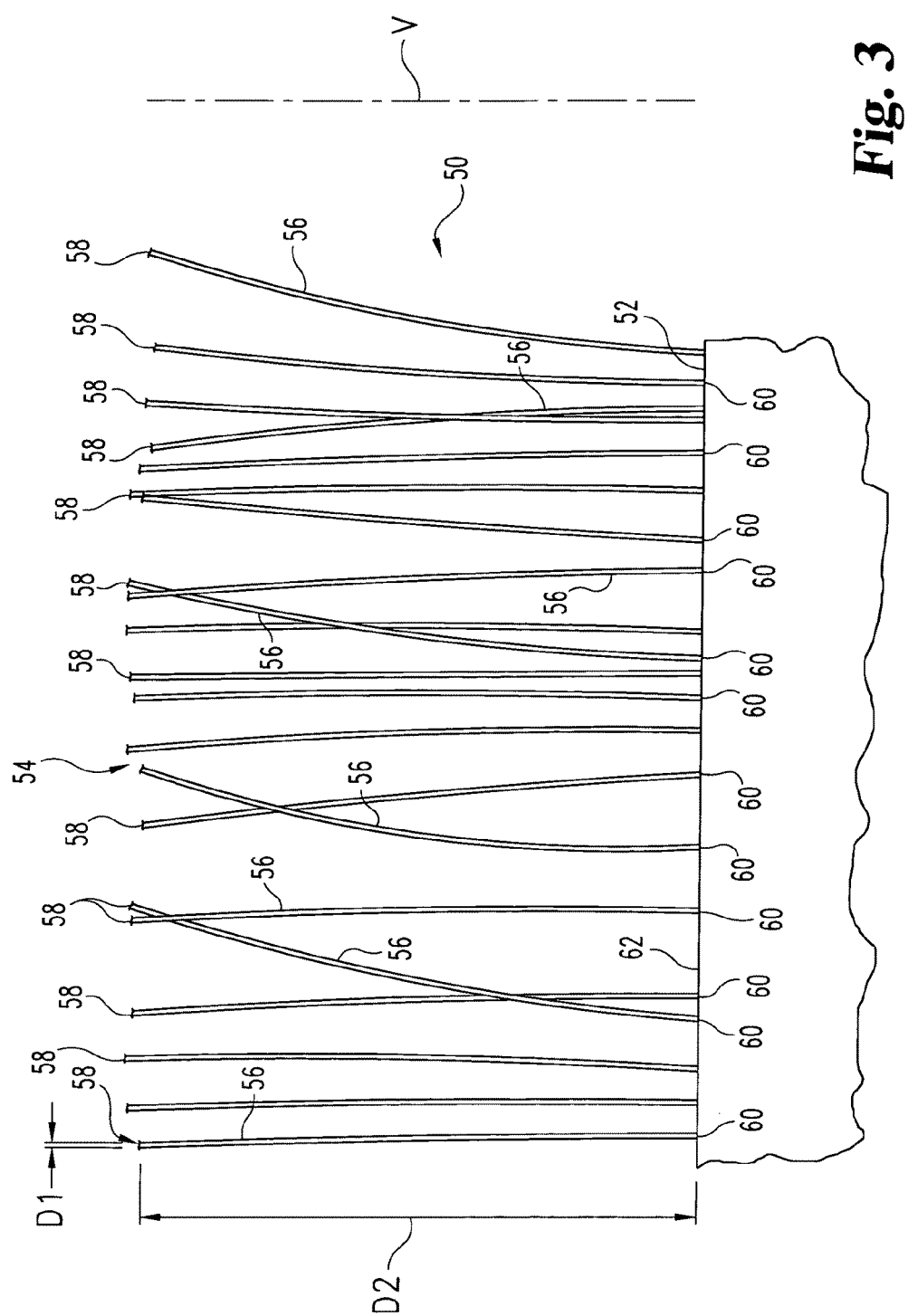
FIG. 3 is a partial, diagrammatic view of a work piece including nanostructures provided in accordance with the process illustrated by the flow chart of FIG. 2.

System 20 includes work piece 50 engaged to work piece holding device 51. Work piece 50 includes substrate 52. A portion of work piece 50 is shown in greater detail in FIG. 3, which is described hereinafter in connection with process 120 of FIG. 2. Referring to FIGS. 2 and 3, process 120 can be performed with system 20. Process 120 begins in stage 122 with the preparation of system 20 and substrate 52 to perform material deposition. Stage 122 also includes placing substrate 52 in chamber 22. Process 120 proceeds from stage 122 to stage 124. In stage 124, pressure control subsystem 24 and temperature control subsystem 26 are utilized to provide appropriate gas pressure and temperature with system 20. In one form, pressure is maintained in a range between about 0.1 torr and about 1.0 torr with pressure control subsystem 24. Temperature control subsystem 26 is utilized to regulate temperature of substrate 52. In one preferred embodiment of this aspect of the invention, nanostructures are formed on a substrate from an organometallic vapor at a substrate temperature of less than 400° C. In a more preferred embodiment, this temperature is in a range between about 200° C. and about 400° C. In other embodiments, the pressure, temperature, and/or different parameters are regulated and varied as would occur to those skilled in the art to achieve a desired result. From stage 124, process 120 continues in stage 126 with evaporation of a source material to provide a desired organometallic deposition vapor. This vapor is utilized to deposit a metal constituent on substrate 52.

In one preferred embodiment of the present invention directed to the formation of nanostructures that include copper (Cu), the vapor is provided in the form of an organometallic having copper as a metal constituent. In one more preferred embodiment directed to nanostructure formation with copper, an organometallic compound is utilized corresponding to formula (a) as follows:

$$Cu(R^1OCOCR^2COR^3)L_x; \quad (a)$$

where:
- $R^1$ is a $C_1$-$C_9$ hydrocarbyl group;
- $R^2$ is hydrogen (H), fluorine (F), or a $C_1$-$C_9$ hydrocarbyl group;
- $R^3$ is a $C_1$-$C_9$ hydrocarbyl group or an alkylsilane group of the formula $\{-Si(R^4)(R^5)(R^6)\}$, in which $R^4$, $R^5$, and $R^6$ are each H, F, a $C_1$-$C_9$ hydrocarbyl group, or a $C_1$-$C_9$ alkoxy group of the formula $\{-OR\}$, in which R is a $C_1$-$C_9$ hydrocarbyl group bonded to silicon (Si);
- x is 1, 2, or 3; and
- L is a ligand including phosphorus (P) of the formula $\{P(R^7)(R^8)(R^9)\}$, in which $R^7$, $R^8$, and $R^9$ are each a hydroxy group, a $C_1$-$C_9$ hydrocarbyl group, or an alkoxy group of the formula $\{-OR\}$, in which R is a $C_1$-$C_9$ hydrocarbyl group.

As used herein, "$C_1$-$C_9$" means that the number of carbons (C) in the identified group is any number from one through nine. In a still more preferred embodiment, each hydrocarbyl group is a $C_1$-$C_9$ alkyl group, which can be a straight chain, branched chain, or cyclic; or an aromatic group with one or more alkyl substituents. Further, it has been found that surplus (free) neutral ligands (Ls) of formula (a) can be present in the compound from which the deposition vapor is formed without adversely impacting desired results, and may possibly be useful in controlling one or more aspects of nanostructure formation. Organocopper precursors of the type described by formula (a) are further described in U.S. Pat. No. 6,538,147 B1 to Choi, which is hereby incorporated by reference.

In another more preferred embodiment directed to nanostructure formation with copper, any organometallic composition conforming to formula (a) is utilized for which CVD deposition of copper can be performed at a temperature of 400° C. or less and at a pressure of 1.0 torr or less. In one even more preferred embodiment directed to nanostructure formation with copper, an organometallic of the following formula (b) is utilized to supply the vapor to chamber 22:

$$Cu(ethylacetoacetate)L_2 \quad (b)$$

where:
- L is a trialkyl phosphite.

This compound is particularly suited to CVD of copper with system 20. During this CVD procedure, the vapor decomposes to release copper under appropriate pressure and temperature conditions as previously described in connection with stage 124, and can be evaporated during stage 126 with evaporation device 32 at a temperature of about 100° C. In another embodiment, the vapor may be provided through means other than evaporation with system 20 as would occur to those skilled in the art.

In other embodiments of the present invention, a different process and/or source material other than a compound of the formula (a) or (b) is utilized for nanostructure formation with copper. In further embodiments, nanostructure formation with other noble metals in addition to or as an alternative to copper is desired. As used herein, a "noble metal" refers to one or more of copper, gold, silver, and platinum. In one preferred alternative, a nanostructure is formed on the substrate from a noble metal other than copper, (such as silver, gold, or platinum) by CVD with an organometallic compound that includes such noble metal instead of copper. The formation of this non-copper, noble metal nanostructure otherwise may be performed in accordance with the copper-based nanostructure and organometallic process 120, or any of its variations, alternatives, or the like. In still other preferred alternative embodiments, noble metal nanostructures can be provided from two or more different noble metals in combination by performing CVD with corresponding organometallic compounds having these different noble metals as respective constituents.

A more preferred embodiment directed to the formation of silver (Ag) nanostructures on a substrate results by performing CVD with an organometallic compound according to formula (c) as follows:

$$Ag(R^1OCOCR^2COR^3)Lx; \quad (c)$$

where: $R^1$, $R^2$, $R^3$, x, and L are the same as described for formula (a) including all alternatives and variations provided in connection therewith. An even more preferred embodiment for silver nanostructure formation uses an organometallic compound according to formula (d) as follows:

$$Ag(ethylacetoacetate)L_2; \text{ where L is a trialkyl phosphite.}$$

In another more preferred embodiment for the formation of gold (Au) nanostructures on a substrate, CVD is performed with an organometallic vapor according to formula (e) as follows:

$$Au(R^1OCOCR^2COR^3)Lx; \quad (e)$$

where: $R^1$, $R^2$, $R^3$, x, and L are the same as described for formula (a) including all alternatives and variations described in connection therewith. An even more preferred embodiment for gold nanostructure formation uses an organometallic compound according to formula (f) as follows: Au (ethylacetoacetate) $L_2$; where L is a trialkyl phosphite. Still other embodiments of the present invention are directed to nanostructure formation with other metals and/or materials with or without one or more noble metals.

Conditional 130 of process 120 corresponds to a decision of whether to deposit an oxide of the metal provided from the vapor. If a metal oxide is desired, then oxygen is introduced into chamber 22 in stage 132. If a metal oxide is not desired, then oxygen is not supplied (stage 132 is skipped), and process 120 proceeds from conditional 130 to stage 140. In embodiments for which oxides are not desired, conditional 130 and stage 132 may not be included in process 120, and correspondingly supply 140 and valve 144 may not be present in system 20. In still other embodiments, process 120 can be adjusted to introduce one or more other types of gaseous material into chamber 22 as an addition or alternative to oxygen.

In stage 140, nanostructures 54 (see FIG. 3) are grown on substrate 52 by depositing material from the organometallic vapor including metal and/or oxygen as appropriate. In alternative embodiments, the introduction of oxygen and/or one or more other any gaseous materials supplied in accordance with stage 132 may be delayed until after the growth of nanostructures 54 has started. For such embodiments, oxygen is only provided during a later portion of nanostructure growth in stage 140.

Surprisingly, it has been discovered that a nanostructure 54 comprised of a material including copper can be formed with process 120 from Cu(ethylacetoacetate)$L_2$ with L=trialkyl phosphite, without a catalyst or reducing agent. Moreover, this nanostructure formation is freestanding, with the nanostructures extending away from substrate 52 and being generally aligned along vertical axis V. Referring particularly to FIG. 3, nanostructures 54 made in accordance with process 120 are shown in the form of nanowires 56 each extending from a substrate contact end 60 to a free end 58. Only a few nanowires 56 with free end 58 and substrate contact end 60 are designated by reference numerals to enhance clarity of FIG. 3. It should be appreciated that these nanowires 56 form without a pattern, template, support, or the like; and lack a solid material positioned between nanowires 56 at one or more boundaries thereof—unlike the carbonaceous material in Ross et al., *Ion-Induced Chemical Vapor Deposition of Copper Films with Nanocellular Microstructures*, APPLIED PHYSIC LETTERS, vol. 83, No. 6 (11 Aug. 2003). Further, there is no solid (such as the carbonaceous material of Ross et al.) that extends from one nanowire 56 boundary to the next during formation and/or that provides a solid structure about nanowires 56.

As stage 140 of process 120 is performed, nanowires 56 are deposited, growing away from substrate surface 62 in a columnar manner along vertical axis V. Nanowires 56 each formed in this matter, have an approximately constant width or diameter represented by dimension D1. The length of each nanowire 56 is represented by dimension D2. Dimensions D1 and D2 are specifically designated in FIG. 3 only for a leftmost nanowire 56 to preserve clarity.

In one preferred embodiment, dimension D1 is 500 nanometers or less and dimension D2 is at least ten times greater than dimension D1 for each of the nanowires 56 formed. In a more preferred embodiment, dimension D1 is 50 nanometers or less and/or dimension D2 is at least 50 times greater than dimension D1. In an even more preferred embodiment, dimension D1 is 10 nanometers or less. For nanostructures 54 based on the even more preferred deposition vapor formed with process 120 by evaporation of the copper precursor, $Cu(ethylacetoacetate)L_2$ with L=trialkyl phosphite, it has been surprisingly found that the resulting nanowires are monocrystalline, having a 5-twinned structure.

Figure 11A:
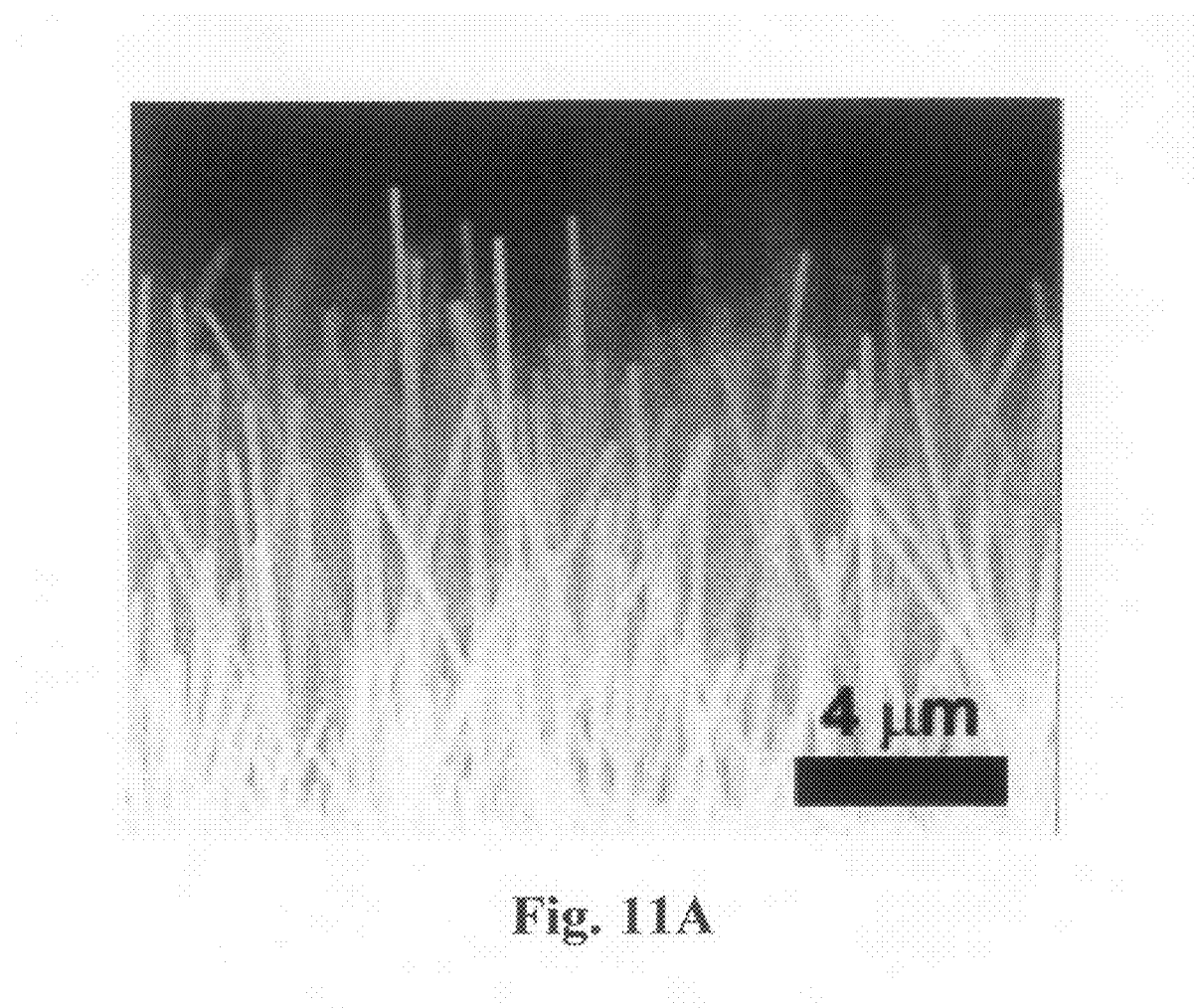
FIG. 11A depicts a computer-generated Scanning Electron Microscope (SEM) image of copper nanowires grown on silicon at approximately 250° C. at low-magnification with a 4 micrometer marker.
Figure 11B:
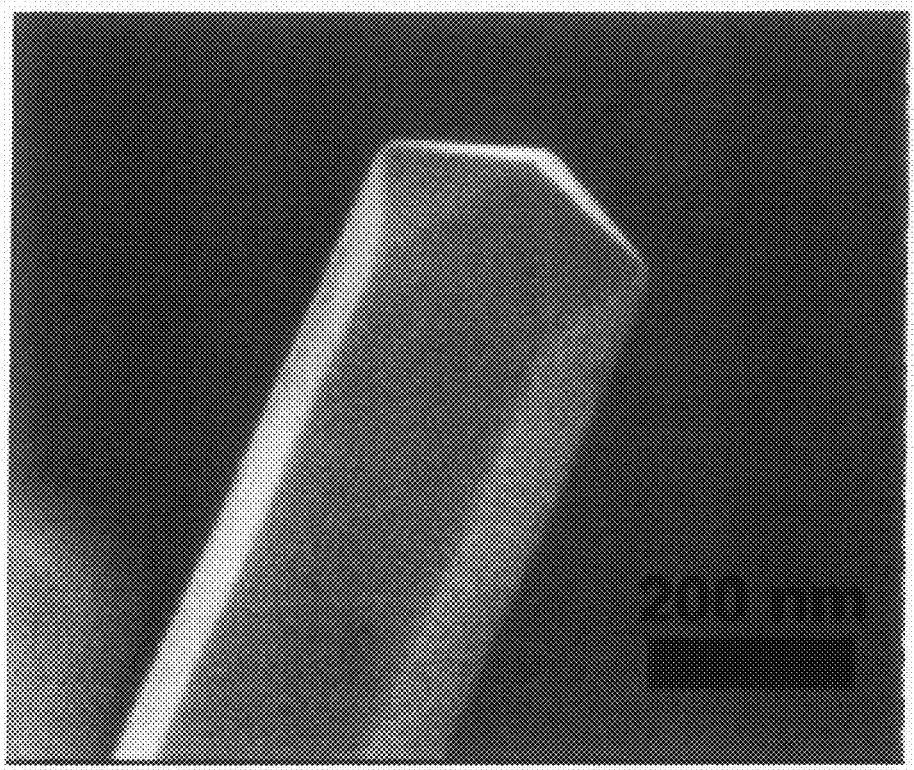
FIG. 11B depicts a computer-generated SEM image of one of the copper nanowires of FIG. 11A at a higher magnification with a 200 nanometer marker.

This five-fold twinned symmetry is indicated in the comparative Scanning Electron Microscope (SEM) images of FIGS. 11A and 11B. For the FIGS. 11A and 11B images, the copper nanowires were prepared with a silicon substrate by vapor deposition of the precursor $Cu(etac)[P(OEt)_3]_2$, where etac is ethyl 3-oxobutanoate and $P(OEt)_3$ is triethyl phosphate (it should be appreciated that ethyl 3-oxobutanoate can be designated alternatively as ethyl acetoacetate, which is listed in formula (b)). Copper nanowires with diameters less than 250 nm in diameter were grown on silicon at 250° C. As best shown in FIG. 11B, the tip of the copper nanowire approximates a pentagonal pyramid formed from five planar surfaces that are joined together to define edges intersecting at an apex of the tip. The discontinuity provided by this tip geometry (such as the pyramidal apex) can be well-suited to electron emission applications, such as those described in connection with FIGS. 5 and 12-14 hereinafter. The image of FIG. 11A is consistent with this indication. It has been observed that for this arrangement, the nanowire grows away from the substrate in an anisotropic manner that primarily increases the longitude of the wire rather than its thickness or diameter. It should be appreciated that this nanowire growth is accomplished with no pre-existing template or patterning device to support the nanowires during growth and define the side boundaries of the nanowires. Further comparable anisotropic, monocrystalline growth has been observed for non-copper noble metal nanowire formation, such as monocrystalline silver nanowires, according to the procedures of the present application.

In a further preferred embodiment, silver (Ag) nanostructures in the form of nanowires have been prepared by CVD with the organometallic compound of formula (c) and/or (d) instead of formula (b), but otherwise using process 120. In a more preferred embodiment, silver nanowires formed in such manner have a corresponding dimension D1 of 500 nanometers or less and dimension D2 at least 10 times greater than dimension D1. In another more preferred form, dimension D1 of these silver nanowires is 50 nanometers or less and/or dimension D2 is at least 50 times greater than dimension D1. In a still even more preferred embodiment, dimension D1 is 10 nanometers or less for these gold nanowires. An even more preferred embodiment provides 5-twinned monocrystalline silver nanowires by performing CVD with the organometallic compound of formula (d).

Another preferred embodiment is a gold (Au) nanostructures in the form of nanowires are prepared by CVD with the organometallic compound of formula (e) and/or (f) instead of formula (b), but otherwise using process 120. In a more preferred embodiment, gold nanowires formed in such manner have a corresponding dimension D1 of 500 nanometers or less and dimension D2 at least 10 times greater than dimension D1. In another more preferred form, dimension D1 of these gold nanowires is 50 nanometers or less and/or dimension D2 is at least 50 times greater than dimension D1. In a still even more preferred embodiment, dimension D1 is 10 nanometers or less for these gold nanowires. An even more preferred embodiment provides 5-twinned monocrystalline gold nanowires by performing CVD with the organometallic compound of formula (d).

Substrate 52 can be comprised of one or more types of material. In one preferred embodiment, at least the portion of substrate surface 62 in contact with nanostructures 54 is made of a metallic or intermetallic material. In another preferred embodiment, at least the portion of substrate surface 62 in contact with nanostructures 54 is made of a semiconductor material that can be doped or undoped such as silicon, germanium, gallium-arsenide, etc. In yet another preferred embodiment, at least the portion of substrate surface 62 in contact with nanostructures 54 is made of a dielectric material. In one more preferred embodiment, this dielectric form of surface 62 includes silicon dioxide. In still other preferred embodiments, at least a portion of substrate surface 62 in contact with nanostructures 54 is comprised of an organic-based polymer or the like. In yet other embodiments, surface 62 can be comprised of a different material as would occur to those skilled in the art. Also, any of these substrate compositions can be used for deposition of noble metal nanostructures other than copper, such as the previously described alternative embodiments of silver nanowires and gold nanowires.

Further embodiments include the deposition of nanoparticles on substrate 52 prior to nanostructure growth in stage 140. Under appropriate conditions, such nanoparticles may be used to influence and/or control nanostructure growth. In one preferred form, these deposited nanoparticles are composed of a metal or metal oxide that can be reduced to a metal under reducing ambience. In a more preferred form, such metal and/or metal oxide nanoparticles are of a noncatalytic type with respect to the precursor material utilized for vapor deposition in stage 140. Nanoparticles may be deposited on substrate 52 using solutions containing desired particles or precursor materials by standard processes, such as spraying, dip-coating, spin-coating, or charged liquid cluster beam (CLCB), to name just a few.

In still further embodiments, a metal may be subsequently deposited on nanostructures produced in stage 140. For example, Ag, Ni, Co, and/or Fe may be applied to copper nanowires or other nanostructures by CVD or other standard techniques. In one particular form, copper nanowires are etched prior to CVD application of Ag, Ni, Co, or Fe to reduce/control the copper nanowire diameter. In other embodiments, a nanowire of a noble metal other than copper may be subject to application of a different metal by CVD or otherwise.

Noble metal nanostructures have numerous industrial applications. Nanostructures 54 produced in stage 140 are utilized in stage 150 of process 120 (see FIG. 2). In stage 150, one or more nanostructures are incorporated into a device. This incorporation is performed using standard techniques and equipment not shown in the FIG. 1 depiction of system 20. Alternatively or additionally, one or more nanostructures are self-assembled into a device of interest as they are formed in stage 140. In one nonlimiting example, substrate 52 is subsequently processed to define other structures/components of a desired device using techniques known to those skilled in the art.

Figure 4:
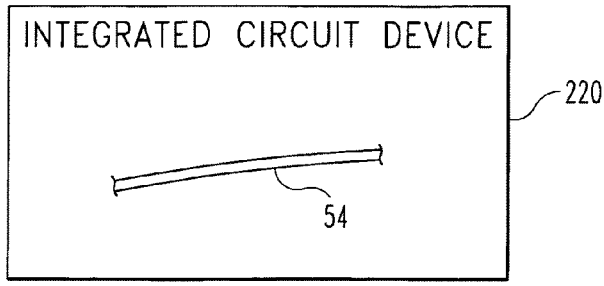
FIG. 4 is a diagrammatic view of an integrated circuit device including one or more nanostructures.
Figure 5:
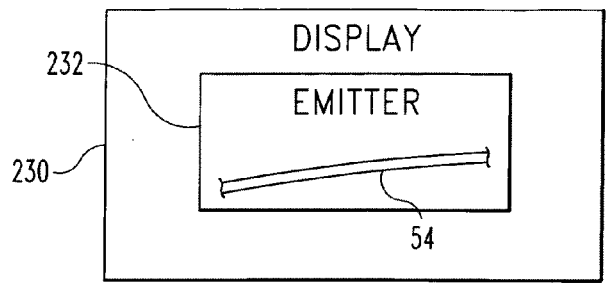
FIG. 5 is a diagrammatic view of a display device including one or more nanostructures.

Referring additionally to FIGS. 4-7, a few nonlimiting examples of nanostructure applications are shown. FIG. 4 illustrates integrated circuit (IC) device 220 including one or more nanostructures 54. Such nanoscale elements are useful in providing higher speed electronic components as would be appreciated by those skilled in the art. FIG. 5 illustrates display 230 with a number of field emitters 232 (only one being shown to preserve clarity). In one preferred embodiment, display 230 is of a flat panel type. Emitter 232 includes a number of nanostructures 54 to facilitate smaller and/or higher resolution display capabilities among other things. In one implementation, several metallic nanowires are bundled together to define a pixel of a electron emitter display device. One nonlimiting form of an electron emitter device using such nanowires is further described in connection with FIGS. 13-15 and accompanying text hereinafter.

Figure 6:
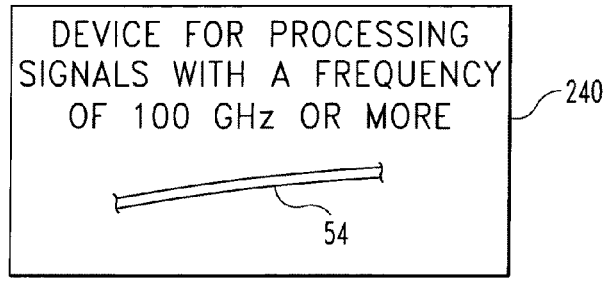
FIG. 6 is a diagrammatic view of a device for processing signals with a frequency of 100 GigaHertz (GHz) or more including one or more nanostructures.
Figure 7:
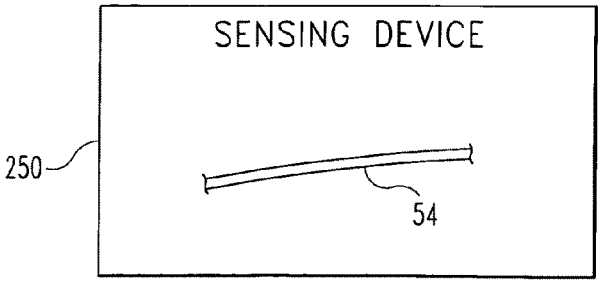
FIG. 7 is a diagrammatic view of a sensing device including one or more nanostructures.

FIG. 6 illustrates device 240 with one or more nanostructures 54 for processing, receiving, and/or transmitting signals at frequencies of 100 GHz or more. U.S. Pat. No. 6,440,763 B1 to Hsu; U.S. Pat. No. 6,465,132 B1 to Jin; and U.S. Pat. No. 6,504,292 B1 to Choi et al. provide additional background information concerning these types of applications. FIG. 7 illustrates sensing device 250 with one or more nanostructures 54. In one form, device 250 is a type of tactile detector that utilizes a set of nanowires as described, for example, in U.S. Pat. No. 6,286,226 B1 to Jin. In a further embodiment, one or more nanowires fabricated according to the present application are utilized as an antenna of wireless communication device. In one variation of this embodiment, multiple antennas of a wireless device are fabricated from nanowires formed in accordance with the present application. In still other embodiments, nanostructures according to the present invention are utilized as would occur to those skilled in the art. Previously described nanostructures (such as nanowires) comprised of a noble metal other than copper, can be included in any of these devices in addition to, or in lieu of, those comprised of copper.

After incorporation of nanostructures 54 in stage 150, process 120 halts. It should be understood that process 120 can be repeated as desired. Further, process 120 can be integrated into one or more device manufacturing procedures using standard techniques known to those skilled in the art. Alternatively or additionally, system 20 can include one or more programmable or dedicated controllers to regulate desired aspects of process 120 including, for example, operation of subsystems 24 and/or 26, the supply of vapor from source 30, the provision of oxygen from supply 40, and/or the operation of such other equipment associated with system 20 (not shown) as would be desired.

Many further embodiments of the present application are envisioned. For example, another embodiment includes: forming two or more nanowires on a substrate by performing vapor deposition with an organometallic vapor including a noble metal; for each of the nanowires, growing a respective freestanding nanowire free end in a direction away from the substrate during this forming that is comprised of the noble metal from the organometallic vapor; and during the growing, advancing the respective nanowire free end of each of the nanowires without providing a different solid or liquid material at boundaries of the nanowires; where the nanowires each include a first dimension of 500 nanometers or less and a second dimension extending from the substrate to the respective nanowire free end at least 10 times greater than the first dimension.

In still another example, a system comprises: means for forming two or more freestanding nanowires on a substrate by performing vapor deposition with an organometallic vapor including a noble metal; means for growing a respective nanowire free end for each of the nanowires in a direction away from the substrate during such formation with the respective nanowire free end of each of the nanowires being comprised of the noble metal included in the organometallic vapor; and means for advancing the respective nanowire free end of each of the nanowires without providing a different solid or liquid material about the nanowires during formation. The nanowires each include a first dimension of 500 nanometers or less and a second dimension extending from the substrate to the respective nanowire free end at least 10 times greater than the first dimension.

Yet another embodiment includes: depositing a number of monocrystalline nanowires on a substrate from an organometallic substance that each are freestanding during deposition and composed of one or more of gold and silver; and providing each of the nanowires with the first dimension of 500 nanometers or less after the deposition is completed and a second dimension extending from the substrate to a free end at least 10 times greater than the first dimension. Yet a further embodiment of the present invention is directed to a system that includes means for depositing a number of monocrystalline nanowires on the substrate from an organometallic substance with the nanowires being freestanding during deposition and composed of one or more of gold and silver; and means for providing each of the nanowires with the first dimension of 500 nanometers or less after the deposition is completed and the second dimension extending from the substrate to a free end at least 10 times greater than the first dimension.

Another embodiment of the present invention is directed to an apparatus, comprising: a substrate; a plurality of freestanding nanowires attached to the substrate that each are monocrystalline and include at least one of gold and silver; and wherein the nanowires each include a respective free end, each have a first dimension of 500 nanometers or less and a second dimension extending from the substrate to the respective free end that is at least 10 times greater than the first dimension.

In another embodiment, a method comprises: forming a number of nanostructures by vapor deposition of an organometallic vapor including a noble metal that are each freestanding and comprises a noble metal during such forming; during the forming, growing a number of nanowire free ends that each correspond to one of the nanostructures without a different solid or liquid material being positioned about the free ends; and providing each of the nanostructures with a first dimension of 500 nanometers or less and a second dimension extending at least 10 times the first dimension.

A further embodiment comprises: an electron emitter device including a substrate and a number of metallic nanowires attached to the substrate with the nanowires each defining a five-twinned monocrystalline structure. Several nonlimiting refinements of this embodiment include: the electron emitter device providing a pixelated display and the nanowires bundled together to define a pixel of the display; an indium-tin-oxide substrate layer; an array of nanowire emitter sites defined by the substrate that each electrically are insulated form one another; and/or the nanowires being comprised of a noble metal. In a more preferred form of this embodiment, the nanowires are comprised of copper.

Another embodiment is directed to a method, comprising: forming one or more metallic nanowires by chemical vapor deposition of an organometallic substance on a substrate, the one or more metallic nanowires each defining a freestanding end portion during the forming thereof; and incorporating the one or more metallic nanowires in a wireless communication device to operate as at least one antenna thereof. In one nonlimiting form of this embodiment, the one or more metallic nanowires are comprised of copper, gold, or silver; and/or the one or more metallic nanowires are monocrystalline.

Yet another embodiment is directed to an apparatus, comprising: a wireless communication device including at least one antenna comprised of one or more monocrystalline metallic nanowires. In one nonlimiting form of this embodiment, the nanowires are comprised of copper, gold, or silver.

Still a further embodiment comprises: defining a number of electron emitter sites on a substrate; electrically insulating the emitter sites from one another; and anisotropically growing a number of metallic monocrystalline nanowires at each of the sites by chemical vapor deposition of an organometallic substance. nonlimiting refinements of this embodiment include: the electron emitter sites each providing a different pixel of a display device including the substrate and nanowires; several of the nanowires bundled together at each of the electron emitter sites; the nanowires each comprised of at least one type of noble metal; and/or the substrate comprised of at least one of silicon and an indium-tin-oxide layer. In a more preferred form of this embodiment, the nanowires are comprised of five-twinned monocrystalline copper.

EXPERIMENTAL EXAMPLES

The following are nonlimiting experimental examples of the present invention and are in no way intended to limit the scope of any aspect of the present invention.

First Experimental Example

Figure 8:
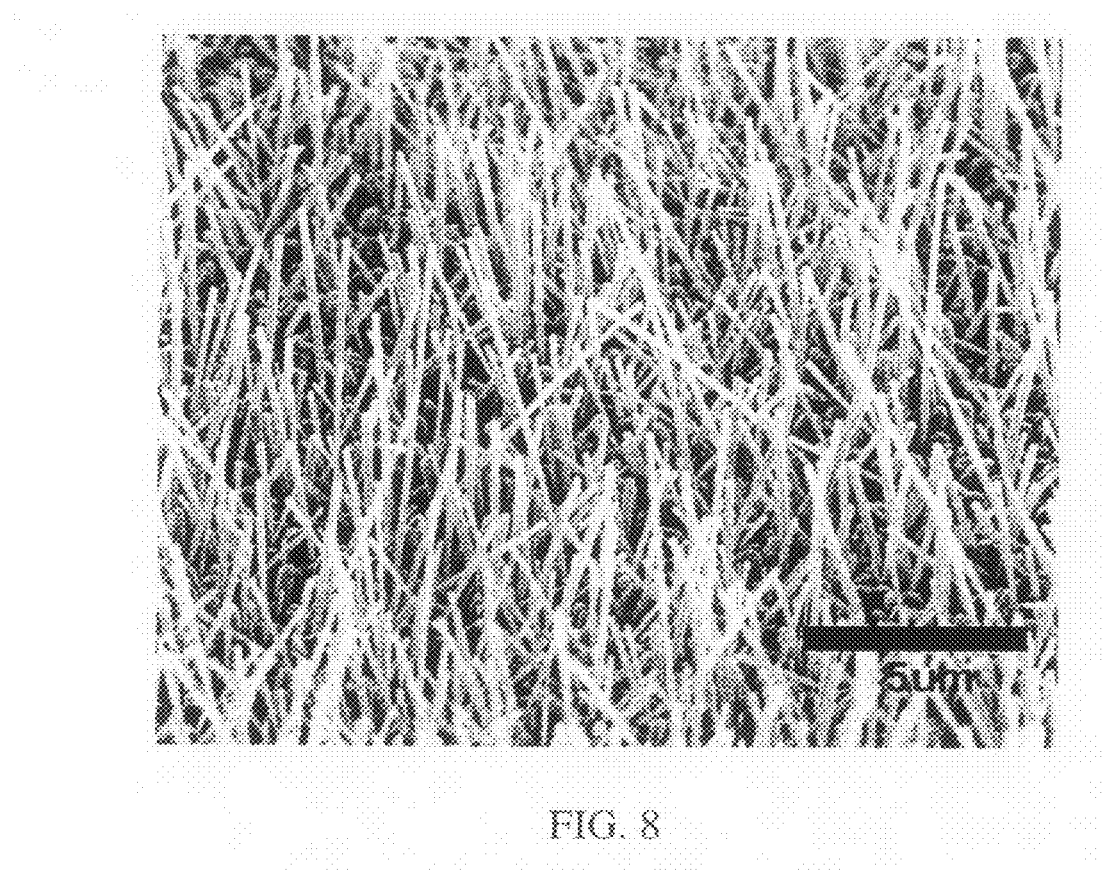
FIG. 8 is a Scanning Electron Microscope (SEM) image of copper nanowires grown on brass in accordance with a First Experimental Example of the present invention.
Figure 9:
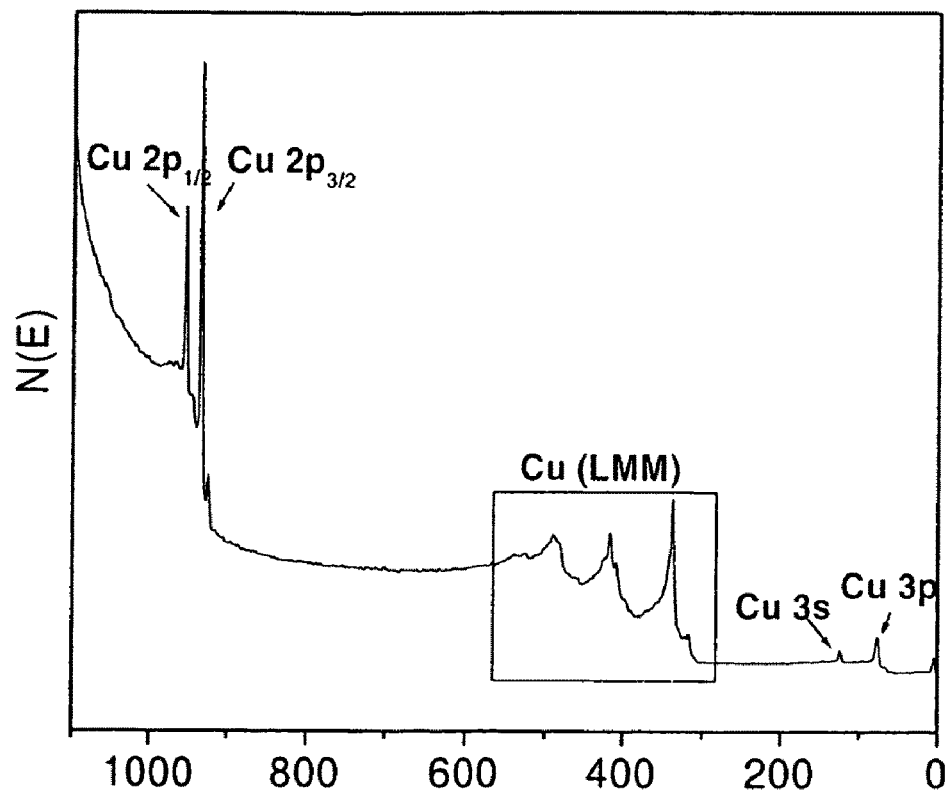
FIG. 9 is a graph depicting an X-ray Photoelectron Spectroscopy (XPS) analysis of copper nanowires formed in accordance with the present invention.
Figure 10:
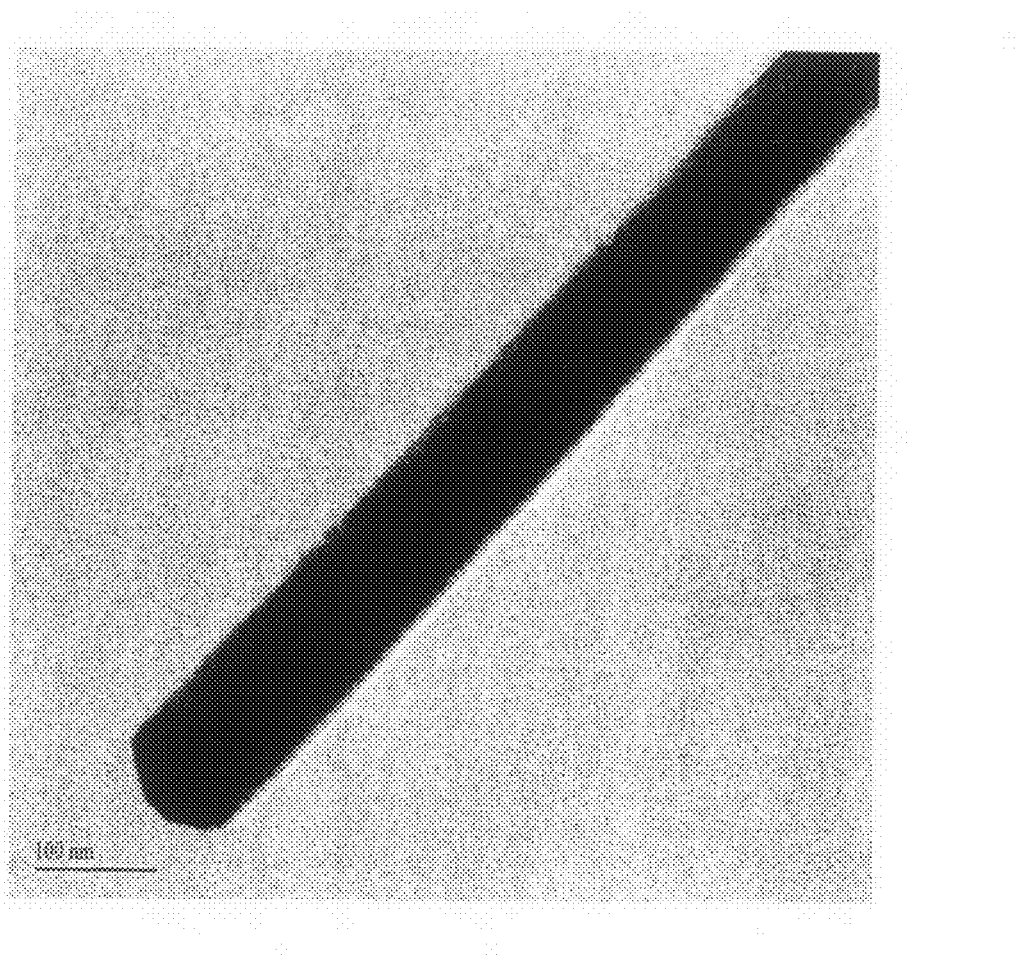
FIG. 10 is a Transmission Electron Microscopy (TEM) image of a copper nanowire formed in accordance with the present invention.

An experimental system like that shown as system 20 in FIG. 1 was set-up and utilized to form monocrystalline, copper nanowires on a brass substrate. For this experiment, the copper precursor, Cu(ethylacetoacetate)$L_2$ with L=trialkyl phosphite, was evaporated at approximately 100° C. and thermally decomposed to deposit copper on the brass substrate at a temperature of about 300° C. Pressure was between 0.1 and 1.0 torr during deposition. Copper nanowires were formed that extended away from the brass substrate. These copper nanowires were freestanding during formation. FIG. 8 provides a Scanning Electron Microscope (SEM) image of the resulting copper nanowires deposited on the brass surface of the substrate. X-ray Photoelectron Spectroscopy (XPS) demonstrated that the experimentally grown copper nanowires were of a highly pure form, consisting essentially of copper. A graph illustrating the XPS analysis is provided in FIG. 9. Transmission Electron Microscopy (TEM) was preformed to generate an image of the experimentally grown copper nanowires which is provided in FIG. 10. FIG. 10 demonstrated that the copper nanowire structure was of a single crystal (monocrystalline) type. The diameters of the copper nanowires generated in this experiment were each less than 500 nanometers. No catalyst or reducing agent was used to produce the resulting copper nanowires.

Electric field emissions of copper nanowires shown in FIG. 8 were measured. These measurements were as low as 8 volts per micrometer, which is significantly lower than etched metal nanowires of comparable dimensions. Accordingly, suitability of the experimentally grown copper nanowires for higher current emitters of the type desired for flat panel displays and/or high-frequency devices was demonstrated.

Second Experimental Example

Utilizing the same set-up as the First Experimental Example previously described, and the same type of copper precursor, copper nanowires were deposited on a silicon (Si) substrate instead of brass. The Si substrate temperature was in a range of 200° C. to 400° C. and under a pressure of 0.1 to 1.0 torr during deposition of the resulting copper nanowires. This experiment was performed both with and without an argon carrier gas during chemical vapor deposition. No catalyst or reducing agent was utilized to produce the resulting copper nanowires.

Third Experimental Example

The same experimental set-up used for the prior described experiments was utilized in a Third Experimental Example except a substrate with a titanium nitride (TiN) surface was utilized and copper nanowires growth thereon. No catalyst or reducing agent was utilized to produce the resulting copper nanowires.

Fourth Experimental Example

The same experimental set-up utilized for the prior described experiments was also utilized to perform the Fourth Experimental Example except that a substrate with a dielectric surface was utilized. This surface was made of silicon dioxide ($SiO_2$). Copper nanowires were grown on the dielectric substrate. No catalyst or reducing agent was utilized to produce the resulting nanowires. Further, copper nanowires can be grown on other metallic, dielectric, intermetallic, and semiconductor substrates utilizing the teachings of the present invention, including organic-based polymer substrate surfaces, and substrates with surface patterning to define regions composed of different materials.

Fifth Experimental Example

The Fifth Experimental Example was performed with the same set-up as the prior described experimental examples except that oxygen was introduced during processing. The oxygen was not introduced until after initial growth of the copper nanowires had begun. The later introduction of oxygen resulted in the formation of at least a portion of each of the nanowires from copper oxide instead of elemental copper. No catalyst or reducing agent was utilized to produce the resulting copper oxide nanowires.

Sixth Experimental Example

The Sixth Experimental Example was performed with the same set-up as the First Experimental Example except that silver nanowires were grown using the organometallic compound of formula (d) on a silicon (Si) substrate. It was further demonstrated that the resulting silver nanowires were of a single crystal, 5-twinned type. The dimensions of this silver nanowires generated in this manner were each less than 500 nanometers. In one particular arrangement, silver nanowires were grown on a silicon (Si) substrate at a temperature between 100 and 200 degrees C.

Seventh Experimental Example

Figure 12:
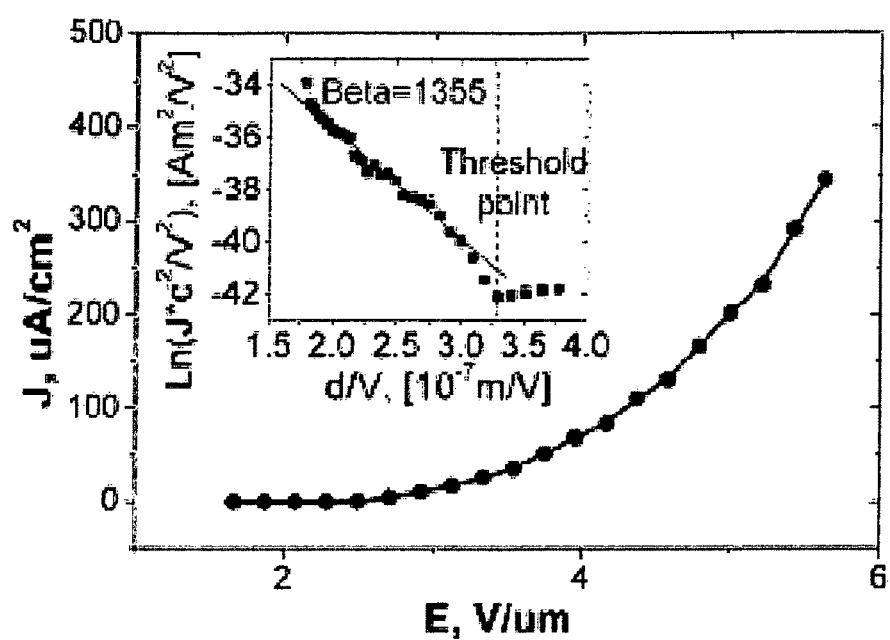
FIG. 12 is graph of a typical J-E curve and an inset of a typical F—N plot of a copper nanowire field emitter.

A Seventh Experimental Example was performed to provide an electron emitter device from monocrystalline copper nanowires made in accordance with the techniques of the present application. These nanowires have a maximum diameter (which is transverse to the nanowire longitude) of less than 250 nms. Field emission characteristics of the copper nanowires were measured using a general diode setup. Field emission was invoked by applying a high voltage (~kV) between the cathode, on which a copper nanowire sample was attached, and the anode. The current by field emission was measured with a sampling resistor (R=461 kΩ). The distance between the cathode and the anode was adjusted from 100 µm to 2000 µm using a step controller. A typical current density (J) versus macroscopic electric field (E) curve is shown in FIG. 12. A low turn-on field of 2.9 V/µm was measured, which is in this case corresponds to the field needed to produce a current density of 10 µA/cm2. Tens of samples were measured under different conditions and a low turn-on field ranging from 2 V/µm to 10 V/µm was verified. It was also found that the interelectrode distance (100-2000 µm) and the substrate (both a Si substrate and an Indium-Tin-Oxide (ITO) glass substrate were tested) did not impact the turn-on field, but higher vacuum (ranging from 10-6 to 10-8 torr) did lead to lower turn-on field.

The inset in FIG. 12 shows a typical Fowler-Nordheim (F—N) plot of the copper nanowire field emitter, where d is the inter-electrode distance, and V the applied voltage. The threshold field, where the J-E curve following the F—N equation commences, was 2.8 V/µm for this sample. The electric field enhancement factor β was determined to be 1355 from the F—N plot by linear curve fitting. A 24-hour stability measurement of the copper nanowire sample was further performed, showing no observable degradation of the emission current.

Figure 13:
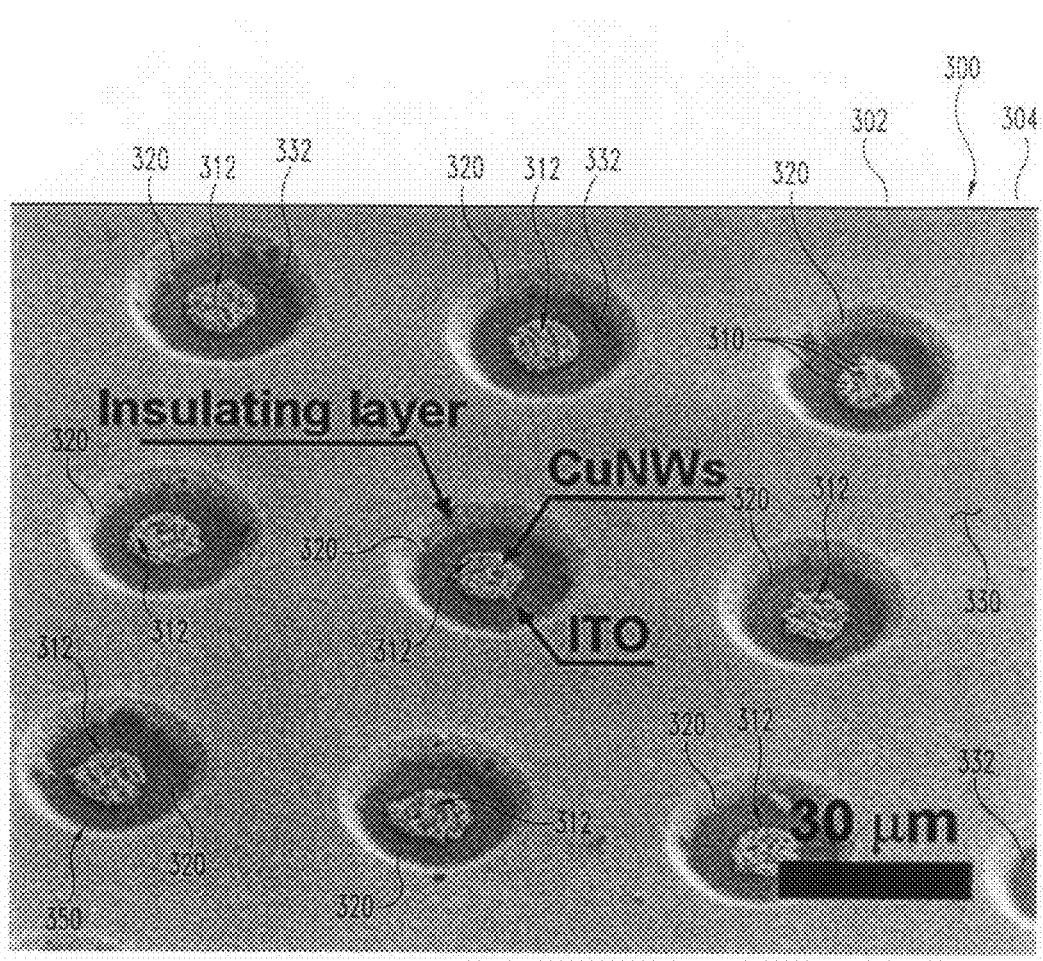
FIG. 13 is a computer-generated SEM image of an electron emitter array device that includes electron emitters in the form of copper nanowires grown on an Indium-Tin-Oxide (ITO)-coated glass substrate (shown with a 30 micrometer marker).
Figure 14:
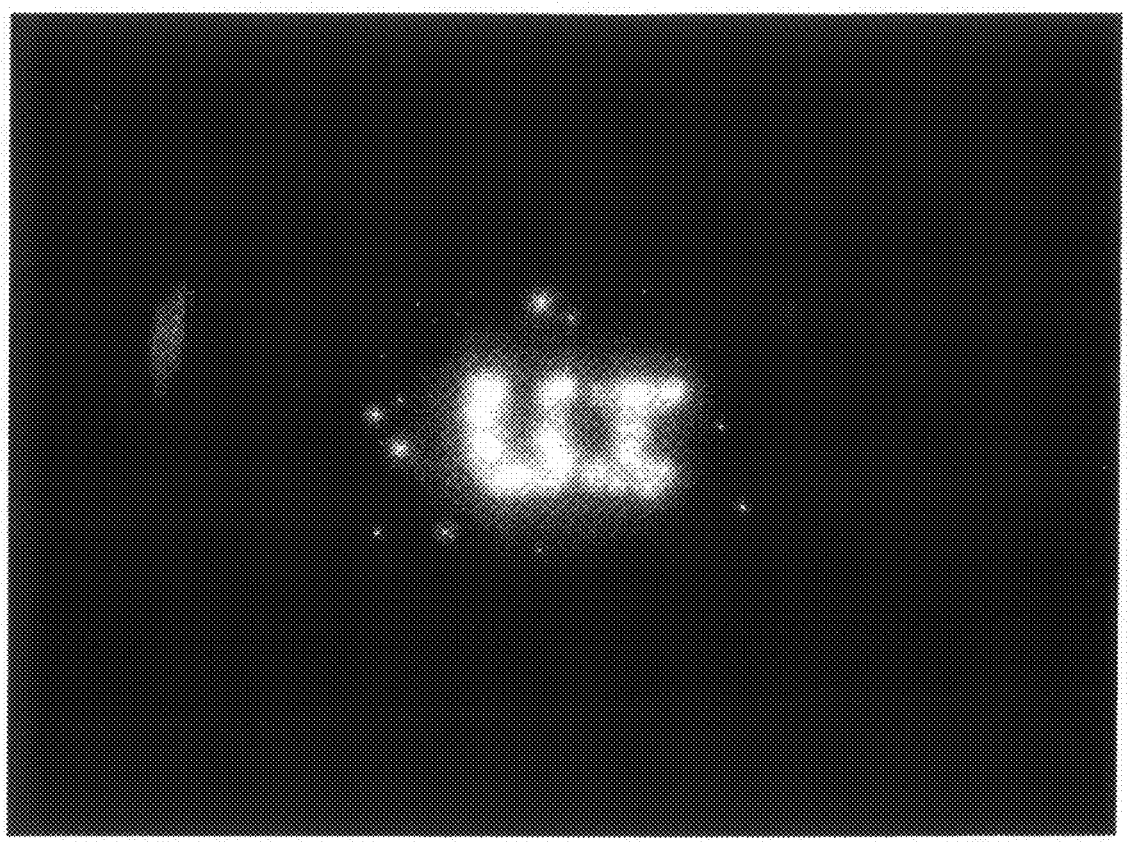
FIG. 14 is a pixelated image generated with electron emitters of an electron emitter device, such as that shown in FIG. 13.

FIG. 13 shows an SEM image of a copper nanowire electron emitter array 300 grown on an ITO-coated glass substrate 302. The indicated substrate structure can be prepared using standard lithographic techniques. Array 300 is alternatively designated electron emitter display device 304 in FIG. 13. Several electron emitter sites 320 in the form of gate holes are spaced apart from one another along the substrate 302 as defined by apertures through electrically insulating layer 330. For each of the electron emitter sites 320, a bundle of several copper nanowires (designated by reference numeral 312) is attached to substrate 302. It should be appreciated that forming bundles 312 from nanowires each having a tip with an approximate pentagonal pyramid shape (as described in connection with FIG. 11B) defines as terminal discontinuity that generally is well-suited to electron emission applications. The ITO layer 332 is positioned below insulating layer 320, being shown at each of the electron emitter sites 320.

With this configuration, a relative large number of emitters 310 in the form of nanowires can be included in each nanowire bundle 312 to provide a longer-lasting field-emission electron source 350. Only a few emitters 310 are specifically designated by reference numerals in FIG. 14 to preserve clarity. Such electron emitters are particularly of interest when used to define a display pixel as previously discussed in connection with FIG. 5. In a further example, FIG. 15 depicts a pixelated image of the letters "UI" generated by an electron emitter display device, such as device 304 shown in FIG. 14; where each pixel is defined by a nanowire bundle 312 of a given electron emitter site 320.

Other Experimental Examples

Other experimental examples include depositing/growing silver nanowires in accordance with the experimental set-up for the Sixth Experimental Example except that metallic, metallic oxide, and organic polymer substrates surfaces were utilized.

In still another example, CVD with the organometallic compound of formula (f) provides gold nanowires utilizing a process set-up otherwise the same as that of the Sixth Experimental Example.

Any theory, mechanism of operation, proof, or finding stated herein is meant to further enhance understanding of the present invention and is not intended to make the present invention in any way dependent upon such theory, mechanism of operation, proof, or finding. All publications, patents, and patent applications cited herein are hereby incorporated by reference, each in its entirety. While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined herein or by the following claims are desired to be protected.

What is claimed is:

1. An apparatus, comprising:
   a substrate;
   a plurality of freestanding nanowires attached to the substrate, the nanowires each being monocrystalline and including at least one of gold and silver; and
   wherein the nanowires each include a respective free end, each have a first dimension of 500 nanometers or less, and each have a second dimension extending from the substrate to the respective free end, the second dimension being at least 5 times greater than the first dimension; and
   wherein the nanowires contact a substrate surface composed of a dielectric.

2. The apparatus of claim 1, wherein the nanowires consist essentially of gold.

3. The apparatus of claim 1, wherein the nanowires consist essentially of silver.

4. The apparatus of claim 1, wherein the first dimension is less than 10 nanometers.

5. An apparatus, comprising:
   a substrate;
   a plurality of freestanding nanowires attached to the substrate, the nanowires each being monocrystalline and including at least one of gold and silver; and
   wherein the nanowires each include a respective free end, each have a first dimension of 500 nanometers or less, and each have a second dimension extending from the substrate to the respective free end, the second dimension being at least 5 times greater than the first dimension; and
   wherein the nanowires have a 5-twinned monocrystalline structure.

6. An apparatus, comprising:
   an electron emitter device including:

a substrate; and a number of monocrystalline metal nanowires attached to the substrate;

wherein the substrate includes an indium-tin-oxide layer.

7. The apparatus of claim 6, wherein the electron emitter device includes a pixelated display and the nanowires are bundled together to define a pixel of the display.

8. The apparatus of claim 6, wherein the substrate defines an array of nanowire emitter sites each electrically insulated from one another.

9. The apparatus of claim 8, wherein the array defines a number of pixels of a display.

10. The apparatus of claim 6, wherein the nanowires are comprised of copper.

11. The apparatus of claim 10, wherein the nanowires each have a five-twinned monocrystalline structure, and each terminate in a tip with a pentagonal pyramidal shape.

* * * * *